(12) United States Patent
Kudou et al.

(10) Patent No.: US 6,594,170 B2
(45) Date of Patent: Jul. 15, 2003

(54) SEMICONDUCTOR INTEGRATED CIRCUIT DEVICE AND SEMICONDUCTOR DEVICE SYSTEM (75) Inventors: Masao Kudou, Yokohama (JP); Natsuki Kushiyama, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/177,583

(22) Filed: Jun. 19, 2002

(65) Prior Publication Data
US 2003/0058676 A1 Mar. 27, 2003

(30) Foreign Application Priority Data
Jun. 19, 2001 (JP) ......................... 2001-185284

(51) Int. Cl.[7] .............. G11C 5/02; G11C 5/06; G11C 8/00
(52) U.S. Cl. .............. 365/51; 365/63; 365/226; 365/233
(58) Field of Search .............. 365/51, 63, 226, 365/230.03, 233; 327/530

(56) References Cited

U.S. PATENT DOCUMENTS

| 6,064,621 | A | * | 5/2000 | Tanizaki et al. | ............ 3365/51 |
| 6,259,647 | B1 | * | 7/2001 | Ooishi | ................... 365/230.03 |
| 6,333,895 | B1 | * | 12/2001 | Hamamoto et al. | ......... 365/233 |
| 6,469,948 | B2 | * | 10/2002 | Mizuno et al. | ............. 365/233 |
| 6,496,444 | B2 | * | 10/2002 | Roohparvar | ................ 365/233 |

FOREIGN PATENT DOCUMENTS

JP    62-185364    8/1987

* cited by examiner

Primary Examiner—Trong Phan
(74) Attorney, Agent, or Firm—Hogan & Hartson, LLP (57) ABSTRACT A semiconductor IC device includes a pad, an input receiver, an input receiver control circuit, an output driver, an output driver control circuit, an input control clock signal line, a reference potential line, an output control clock signal line, a first power supply line, and a second power supply line. The input receiver, the input receiver control circuit, the output driver control circuit, the input control clock signal line, the reference potential line, the output control clock signal line, and the first power supply line are arranged on one side of the pad, while the output driver and the second power supply line are arranged on the other side of the pad.

10 Claims, 7 Drawing Sheets

PRIOR ART

SEMICONDUCTOR INTEGRATED CIRCUIT DEVICE AND SEMICONDUCTOR DEVICE SYSTEM

CROSS-REFERENCE TO RELATED APPLICATIONS

This application is based upon and claims the benefit of priority from the prior Japanese Patent Application No. 2001-185284, filed Jun. 19, 2001, the entire contents of which are incorporated herein by reference.

BACKGROUND OF THE INVENTION

1. Field of the Invention

The present invention relates to a semiconductor integrated circuit (IC) device and semiconductor device system and, more particularly, to a synchronous semiconductor IC device and semiconductor device system.

2. Description of the Related Art

Presently, there has been widely used such a semiconductor memory for inputting/outputting data in synchronization with an external clock signal as synchronous DRAM (SDRAM), a double data-rate synchronous DRAM (DDR-SDRAM) and a ram-bus DRAM (RDRAM).

Of these, a DDR-SDRAM use an external reference potential VREF to decide a HIGH/LOW logical level of an external pin such as a data external pin.

Figure 1:
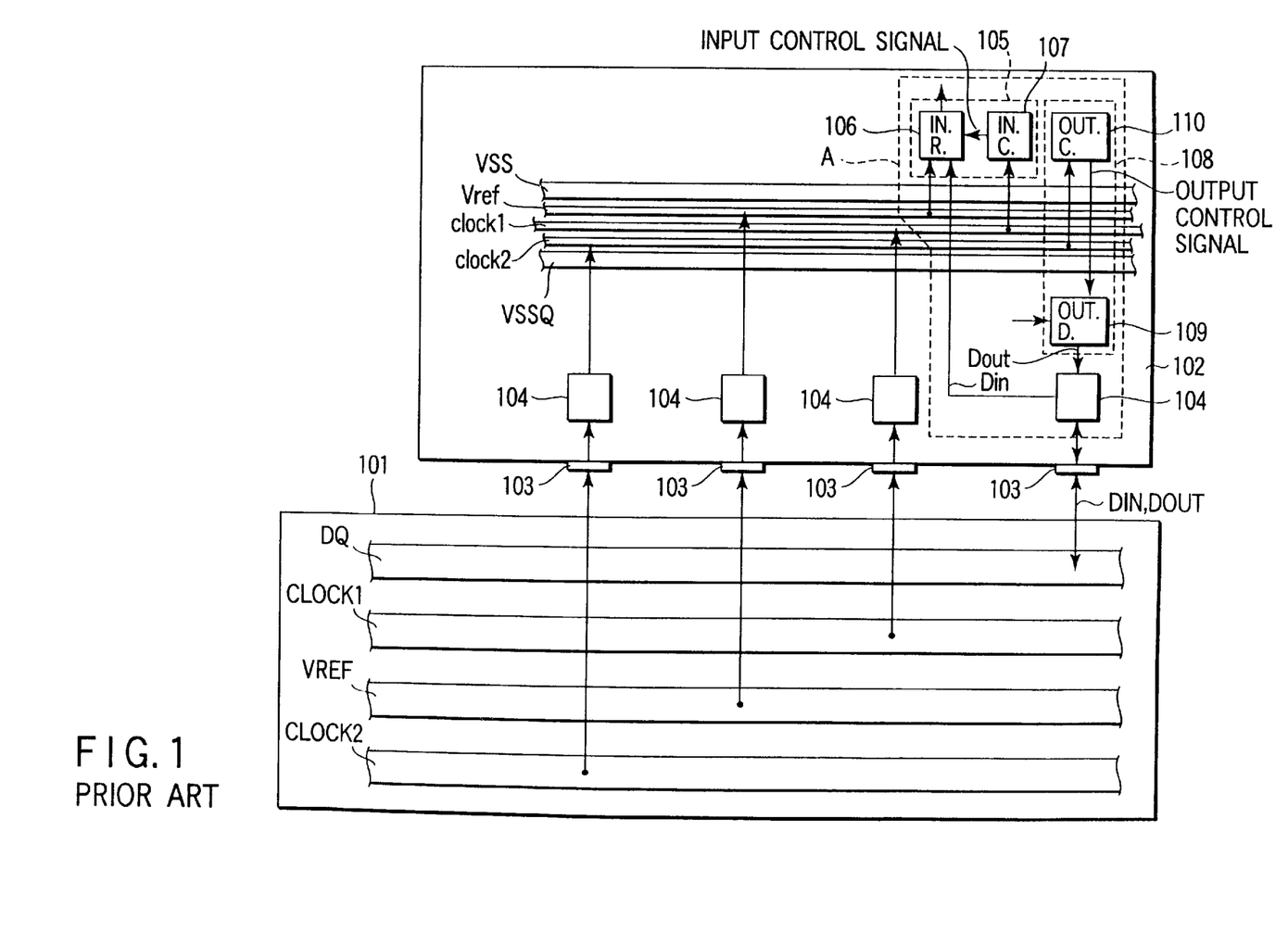
FIG. 1 is a block diagram for showing a conventional semiconductor device system.
Figure 2:
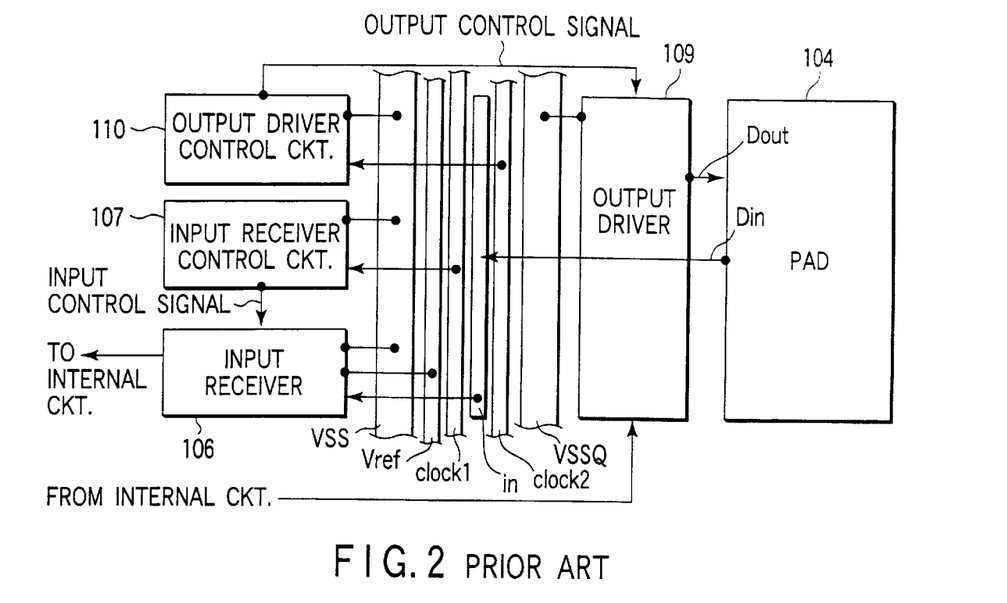
FIG. 2 is an expanded view for showing a frame A surrounded by a broken line in FIG. 1.

FIG. 1 is a block diagram for outlining a semiconductor device system in which such a synchronous semiconductor memory is incorporated and FIG. 2, an expanded view for showing a frame A surrounded by a broken line in FIG, 1.

As shown in FIG. 1, on a wiring board are arranged as external wiring lines an external signal line (DQ) through which are propagated external signals (external input signal DIN and external output signal DOUT in this specification), an external reference potential line (VREF) to which is applied the external reference potential used in decision of the logical level of the external input signal DIN, an external input control clock signal line (CLOCK1) through which is propagated an external input control clock signal CLOCK1, and an external output control clock signal line (CLOCK2) through which is propagated another external output control clock signal CLOCK2. To the wiring board 101 is electrically connected a synchronous semiconductor memory 102.

The synchronous semiconductor memory 102 is provided with external pins 103, to which the wiring lines arranged on the wiring board 101 are connected. These external pins 103 are electrically connected via a pad 104 to internal wiring lines arranged in the synchronous semiconductor memory 102. In the example shown in FIGS. 1 and 2, those wiring lines connected to the external wiring lines include an internal reference potential line (Vref) electrically connected to the external reference potential line (VREF), an internal input control clock signal line (clock1) electrically connected to the external input control clock signal line (CLOCK1), and an internal output control clock signal line (clock2) electrically connected to the external output control clock signal line (CLOCK2).

Next, the following will describe operations of these lines.

<Operations When Inputting Signal>

The signal is input in synchronization with at least one of leading and trailing edges of the internal input control clock signal clock1 synchronized with the external input control clock signal CLOCK1.

Specifically, an input circuit 105 receives an external input signal DIN through the pad 104 as an internal input signal Din. Then, it decides the logical level of this internal input signal Din against the internal reference potential Vref.

The logical level is specifically decided by an input receiver (IN.R.) 106 of the input circuit 102. The input receiver 106 compares, for example, the potential of the internal input signal Din to that of the internal reference potential Vref. If the potential of the internal input signal Din is lower than the internal reference potential Vref, it decides that the logical level is "LOW" and, if it is lower than that, decides that the logical level is "HIGH".

The input receiver 106 is controlled by an input receiver control circuit (IN.C.) 107. The input receiver control circuit 107 generates an input control signal synchronized with this internal input control clock signal clock1 based on the internal input control clock 1 synchronized with the external input control clock signal CLOCK1. The input receiver 106 takes in the internal input signal Din in response to the input control signal to then output this internal input signal Din to the inside of the synchronous semiconductor memory 102.

<Operations When Outputting Signal>

As in the case of signal inputting, the signal is output in synchronization with at least the leading and trailing edges of the internal output control clock clock2 synchronized with the external output control clock CLOCK2.

Specifically, an output circuit 108 is comprised of an output driver (OUT.D.) 109 and an output driver control circuit (OUT.C.) 110. An internal output signal Dout output from the inside of the synchronous semiconductor memory 102 is input to the output driver 109.

The output driver 109 is controlled by the output driver control circuit (OUT.C.) 110. The output receiver control circuit 110 generates an output control signal synchronized with the internal output control clock signal clock2 based on the internal output control clock signal clock2 synchronized with the external output control clock signal CLOCK2. The output driver 109 outputs the internal output signal Dout in synchronization with the output control signal to thereby drive the external signal line DQ via the pad 104 and the external pins 103. Thus, an external output signal DOUT is propagated to the external signal line DQ.

It is here assumed that noise occurred in such a synchronous semiconductor memory 102 and had an influence on the internal input control clock signal clock1, the internal output control clock signal clock2, and the internal reference potential Vref. In this case, the following situation is expected.

<When Internal Input Control Clock Signal Clock1 is Affected by Noise>

Figure 3A:
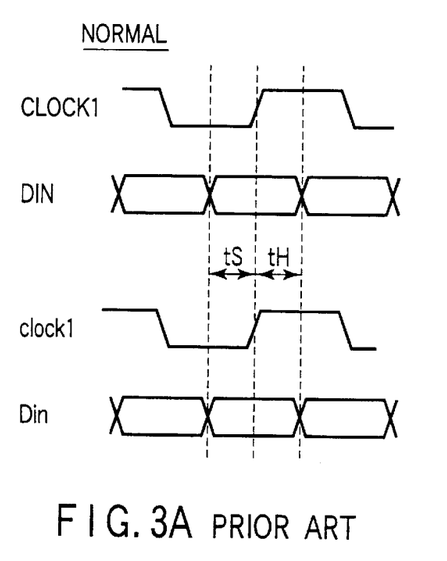
FIGS. 3A and 3B are diagrams for showing waveforms of signals when they are input.
Figure 3B:
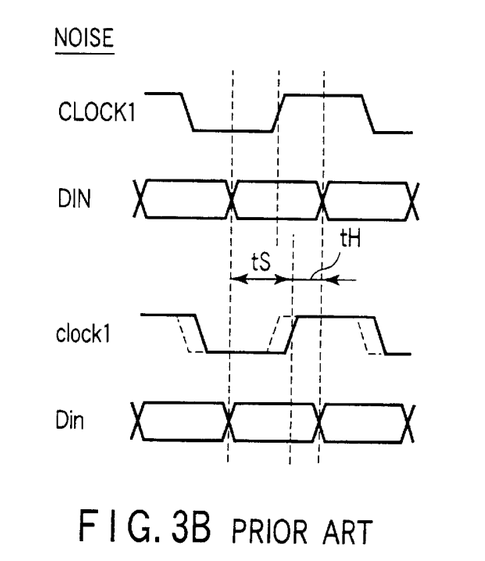

As shown in FIGS. 3A and 3B, if the internal input control clock signal clock1 is affected by noise, for example, it is shifted in phase with respect to the external input control clock signal CLOCK1. This causes in turn the timing for taking in a signal by the input circuit 105 to be shifted from the edge of the external input control clock signal CLOCK1. This results in a change in a set-up time tS and a hold time tH of the input circuit 105. If the set-up time tS and the hold time tH change, it is difficult for the input circuit 105 to take in the signal.

<When Internal Output Control Clock Signal Clock2 is Affected by Noise>

Figure 4A:
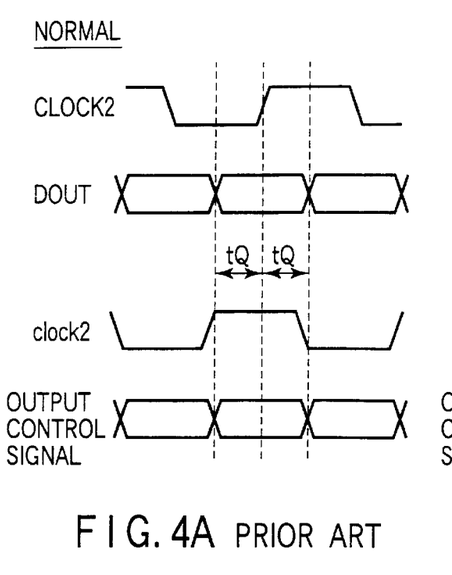
FIGS. 4A and 4B are diagrams for showing waveforms of the signals when they are output.
Figure 4B:
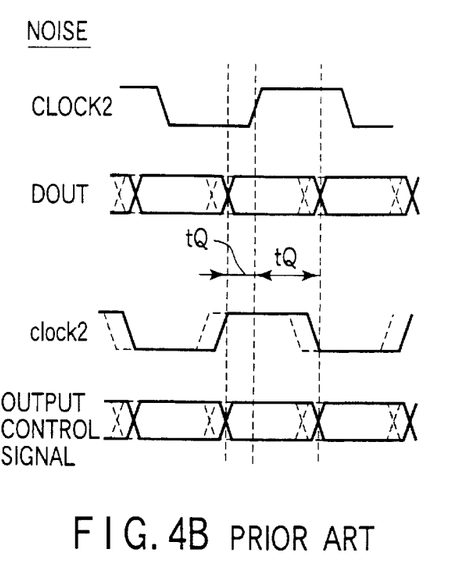

As shown in FIGS. 4A and 4B, if the internal output control clock signal clock2 is affected by noise, as in the case of the above-mentioned clock signal clock1, for example, the clock signal clock2 is shifted in phase with respect to the external output control clock signal CLOCK2. This causes in turn the timing for outputting a signal by the output circuit 108 to be shifted from the edge of the external output control clock signal CLOCK2. As a result, the timing for propagating the external output signal DOUT through the external signal line DQ is shifted from the edge of the external output control clock signal CLOCK2, thus resulting in a change in an output time tQ. If the output time tQ changes, for example, it is difficult for a memory controller, not shown, to take in the external output signal DOUT.

<When Internal Reference Potential Vref is Affected by Noise>

Figure 5A:
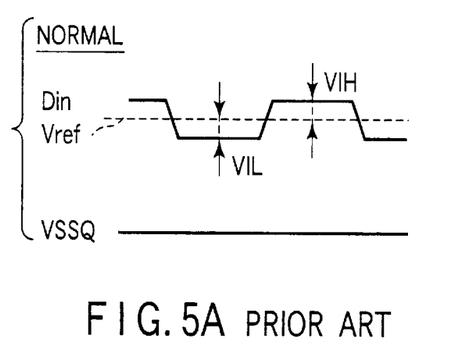
FIGS. 5A and 5B are diagrams for showing waveforms of voltages for logical level decision.
Figure 5B:
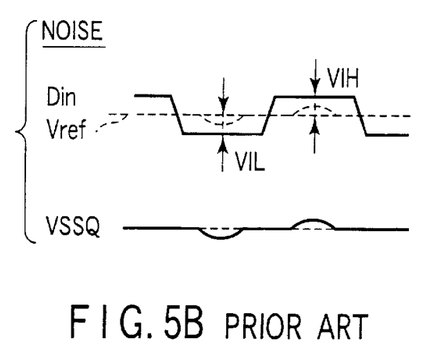

As shown in FIGS. 5A and 5B, if the internal reference potential Vref is affected by noise, its potential fluctuates. If the internal reference potential Vref fluctuates, a difference in potential between itself and the "LOW" or "HIGH" level of an input signal decreases. Originally the internal reference potential Vref is set at an intermediate position between the "LOW" and "HIGH" levels. As such, if the potential difference between the internal reference potential Vref and the "LOW" or "HIGH" level is decreased, it is difficult for the input receiver 106 to decide the logical level.

Presently, to guard against these problems, for the set-up time tS, the hold time tH, and the output time tQ are preserved respective timing margins (hereinafter called tS margin, tH margin, and tQ margin respectively) and, for the internal reference potential Vref also are preserved voltage margins (hereinafter called VrefL margin and VrefH margin).

Taking into account ever the increasing speed and quantity of data transmitted for the synchronous semiconductor memories, however, the frequencies of the external input control clock signal CLOCK1, the internal output control clock signal CLOCK2 will be further increased highly possibly. It is, therefore, difficult to preserve the tS, tH, and tQ margins sufficiently.

Furthermore, taking into account a demand for an increase in the integration density and storage capacity of the synchronous semiconductor memories, the power supply voltage may be lowered further, in which case it is difficult also to preserve the VrefL and VrefH margins.

BRIEF SUMMARY OF THE INVENTION

A semiconductor integrated circuit device according to a first aspect of the present invention comprises: a pad array including a plurality of pads; a first circuit array arranged at one side of the pad array, the first circuit array including a plurality of input receiver, a plurality of input receiver control circuits, and a plurality of output driver control circuits; a first power supply line arranged between the first circuit array and the pad array, the first power supply line being connected to the plurality of input receivers, the plurality of input receiver control circuits, and the plurality of output driver control circuits; a reference potential line arranged between the first circuit array and the pad array, the reference potential line being connected to the plurality of input receivers; an input control clock signal line arranged between the first circuit array and the pad array, the input control clock signal line being connected to the plurality of input receiver control circuits; a plurality of input signal lines arranged between the first circuit array and the pad array, the plurality of input signal lines being connected to the plurality of input receivers; an output control clock signal line arranged between the first circuit array and the pad array, the output control clock signal line being connected to the plurality of output driver control circuits; a second power supply line arranged at the other side of the pad array; and a second circuit array arranged between the second power supply line and the pad array, the second circuit array including a plurality of output drivers connected to the second power supply line.

A semiconductor device system according to a second aspect of the present invention comprises: a wiring board; and a semiconductor integrated circuit device electrically coupled to the wiring board, the wiring board including: an external signal line to which is applied an external signal; an external reference potential line to which is applied an external reference potential used to decide a logical level of the external signal; an external input control clock signal line to which is applied an external input control clock signal; and an external output control clock signal line to which is applied an external output control clock signal, the semiconductor integrated circuit device including: a pad array, the pad array including a first pad electrically coupled to the external signal line, a second pad electrically coupled to the external reference potential line, a third pad electrically coupled to the external input control clock signal line, and a fourth pad electrically coupled to the external output control clock signal line; an internal reference potential line, the internal reference potential line arranged at one side of the pad array and electrically connected to the second pad; an internal input control clock signal line, the internal input control clock signal line arranged at the one side of the pad array and electrically coupled to the third pad; an internal output control clock signal line, the internal output control clock signal line arranged at the one side of the pad array and electrically coupled to the fourth pad; an input control circuit, the input control circuit arranged at the one side of the pad array and electrically coupled to the internal input control clock signal line; an input receiver, the input receiver arranged at the one side of the pad array and electrically coupled to the input control circuit, the first pad and the internal reference potential line; an output control circuit, the output control circuit arranged at the one side of the pad array and electrically coupled to the internal output control clock signal line; a first power supply line, the first power supply line arranged at the one side of the pad array and electrically coupled to the input control circuit, the input receiver and the output control circuit; an output driver, the output driver arranged at the other side of the pad array and electrically coupled to the output control circuit and the first pad; and a second power supply line, the second power supply line arranged at the side of the pad array and electrically coupled to the output driver.

DETAILED DESCRIPTION OF THE INVENTION

The present inventors have found that one of the causes that noise occurs in a semiconductor IC device is noise which occurs along an internal output power supply line for supplying power to an output circuit of the device. The output circuit, especially its output driver, drives an external signal line and so has a large current driving capacity. As such, the internal output power supply line receives a flow of a large current as compared to, for example, a power supply line for supplying power to the input circuit etc. Moreover, although it is given to drive the external signal line, the internal output power supply line is formed in the semiconductor IC device and so it is very small in wiring capacity with respect to the semiconductor device system as a whole. It is, therefore, liable to give rise to noise. Noise generated on this internal output power supply line propagates by coupling to the internal input control clock signal line, the internal reference potential line, and the internal output control clock signal line in the semiconductor IC device.

To guard against this, as in the above-mentioned semiconductor IC device and semiconductor device system, a second circuit section including at least the last stage transistor and the output power supply line for supplying power to this transistor in the output circuit are arranged on the other side of the pads.

Owing to this configuration, the internal input control clock signal line, the internal reference potential line, and the internal output control clock signal line can all be remote from the output power supply line, to thereby mitigate noise transmitted by coupling to themselves from the output power supply line.

The following will describe one embodiment of the present invention with reference to the drawings. In this description, the same components are indicated by the same reference symbols over all the drawings.

Figure 6:
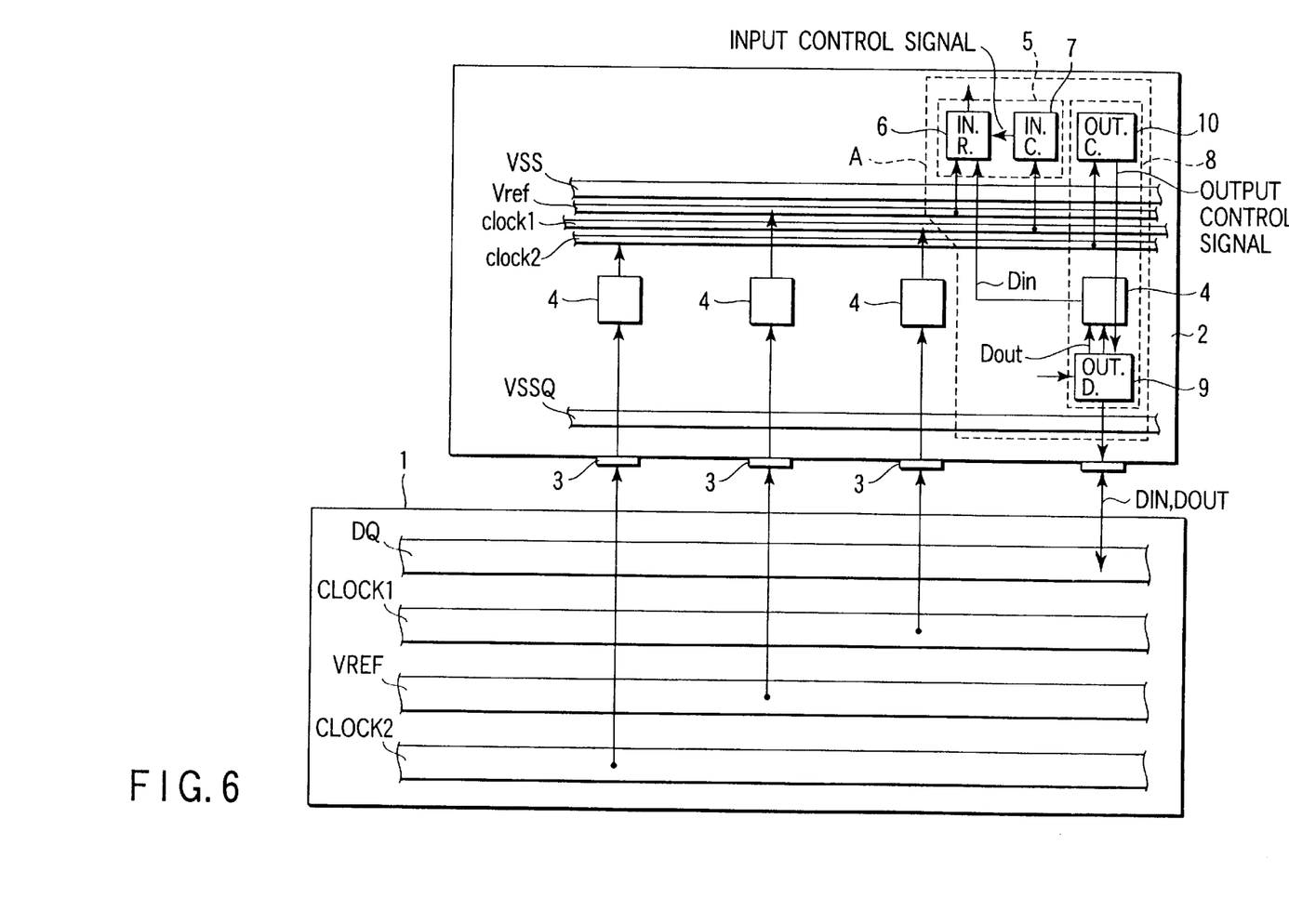
FIG. 6 is a block diagram for outlining a semiconductor device system regarding one embodiment of the present invention.
Figure 7:
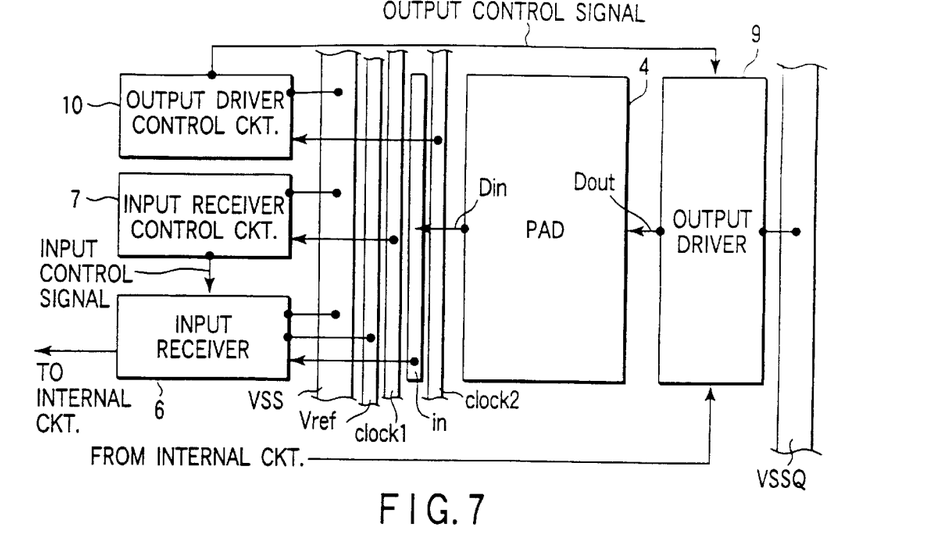
FIG. 7 is an expanded view for showing a frame A surrounded by a broken line in FIG. 6.

FIG. 6 is a block diagram for outlining a semiconductor IC device and semiconductor device system regarding one embodiment of the present invention and FIG. 7, an expanded view for showing a frame A surrounded by a broken line in FIG. 6.

As shown in FIG. 6, on a wiring board 1 are arranged as external wiring lines an external signal line (DQ) through which are propagated external signals (external input signal DIN and external output signal DOUT in this specification), an external reference potential line (VREF) to which is applied the external reference potential used in decision of the logical level of the external input signal DIN, an external input control clock signal line (CLOCK1) through which is propagated an external input control clock signal CLOCK1, and an external output control clock signal line (CLOCK2) through which is propagated another external output control clock signal CLOCK2. To the wiring board 1 is electrically connected a semiconductor IC device regarding the present invention, a synchronous semiconductor memory 2 in this embodiment. The synchronous semiconductor memory 2 is such a SDRAM, DDR-SDRAM, or RDRAM. Besides these DRAMs, a synchronous SRAM or a nonvolatile memory may be employed.

The synchronous semiconductor memory 2 has external pins 3, to which the wiring lines arranged on the wiring board 1 are connected respectively. These external pins 3 are electrically connected via a pad 4 to internal wiring lines arranged in the synchronous semiconductor memory 2. In this embodiment, those internal wiring lines connected to the external wiring lines include an internal reference potential line (Vref) electrically connected to the external reference potential line (VREF), an internal input control clock signal line (clock1) electrically connected to the external input control clock signal line (CLOCK1), and an internal output control clock signal line (clock2) electrically connected to the external output control clock signal line (CLOCK2).

On one side of the pads 4 are arranged an input circuit 5 for receiving via the pad 4 the external input signal DIN and an output driver control circuit 10 for controlling an output driver 9 in an output circuit 8. Besides, of the internal wiring lines connected to the external wiring line and the internal power supply lines are arranged the internal output control clock signal line (clock2), an internal signal line (in, see FIG. 7 but not shown in FIG. 6) for interconnecting the pads 4 and the input receiver 6, the internal reference potential line (Vref), the internal input control clock signal line (clock1), the input circuit 8, and the power supply lines (only a low voltage potential power supply VSS is shown but a high potential power supply VCC is not shown) for supplying power to an output driver control circuit 10 sequentially from the one nearest the pads 4.

On the other side of the pads 4 are arranged the output driver 9 and such an output power supply line (VSSQ) of the internal power supply lines as to supply power to the output driver 9.

The following will describe the operations.

<Operations When Inputting Signal>

A signal is input in synchronization with at least one of the rising and falling edges of the internal input control clock signal clock1 synchronized with the external input control clock signal CLOCK1.

Specifically, the input circuit 5 receives the external input signal DIN through the pad 4 as an internal input signal Din. Then, it decides the logical level of this internal input signal Din against the internal reference potential Vref.

The logical level is specifically decided by an input receiver (IN.R.) 6 of the input circuit 2. The input receiver 6 compares, for example, the potential of the internal input signal Din to that of the internal reference potential Vref. In a case where the input receiver 6 is based on the positive logic, if the potential of the internal input signal Din is lower than the internal reference potential Vref, it decides that the logical level is "LOW". In a case where the input receiver 6 is based on the negative logic, conversely, if the potential of the internal input signal Din is lower than the internal reference potential Vref, it decides that the logical level is "HIGH".

The input receiver 6 is controlled by an input receiver control circuit (IN.C.) 7. The input receiver control circuit 7 generates an input control signal synchronized with this internal input control clock signal clock1 based on the internal input control clock 1 synchronized with the external input control clock signal CLOCK1. The input receiver 6 takes in the internal input signal Din in response to the input control signal to then output this internal input signal Din to the inside of the synchronous semiconductor memory 2. If the internal input signal Din thus taken in is input data, it is output toward a memory core section including, for example, a sense-amplifier or a memory array. If it is an address signal, it is output toward, for example, an address decoder etc., while if it is a command signal, it is output toward a command register etc.

<Operations When Outputting Signal>

As in the case of signal inputting, the signal is output in synchronization with at least one of the rising and falling edges of the internal output control clock clock2 synchronized with the external output control clock CLOCK2.

Specifically, the output circuit 8 is comprised of an output driver (OUT.D.) 9 and an output driver control circuit (OUT.C.) 10. The internal output signal Dout output from the inside of the synchronous semiconductor memory 2 is input to the output driver 9.

The output driver 9 is controlled by the output driver control circuit (OUT.C.) 10. The output receiver control circuit 10 generates an output control signal synchronized with the internal output control clock signal clock2 based on the internal output control clock signal clock2 synchronized with the external output control clock signal CLOCK2. The output driver 9 outputs the internal output signal Dout in synchronization with the output control signal to thereby drive the external signal line (DQ) via the pad 4 and the external pins 3. Thus, the external output signal DOUT is propagated to the external signal line DQ.

According to such a semiconductor device system regarding this embodiment, the output driver 9 including at least the last stage transistor and the output power supply line VSSQ for supplying power to this transistor in the output circuit 8 are arranged on the other side of the pads 4, thus making it possible to keep the internal input control clock signal line (clock1), the internal reference potential line (Vref), and the internal output control clock signal line (clock2) far away from the output power supply line VSSQ.

Figure 8A:
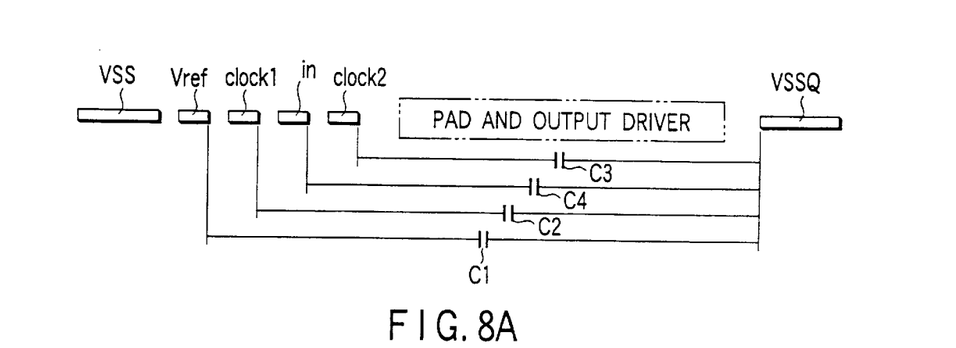
FIGS. 8A and 8B are illustrations for comparing coupling capacitance of an internal wiring line of the semiconductor IC device regarding the one embodiment of the present invention to that of the conventional semiconductor IC device.
Figure 8B:
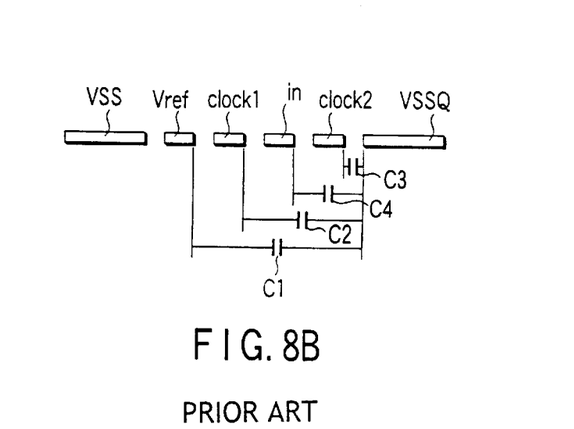

Owing to this configuration, as shown in FIG. 8A, capacitance items C1, C2, and C3 between the output power supply line VSSQ and the internal reference potential line (Vref), the internal input control clock signal line (clock1), and the internal output control clock signal line (clock2) respectively can all be reduced as compared to those by the conventional synchronous semiconductor memory shown in FIG. 8B.

This makes it possible to mitigate noise transmitted by coupling from the output power supply line VSSQ to the internal input control clock signal line (clock1), the internal reference potential line (Vref), and the internal output control clock signal line (clock2).

As a result of this mitigation of noise, it is possible to suppress such a shift in phase between the external input control clock signal CLOCK1 and the internal input control clock signal clock1 as shown in FIG. 3B, such a shift in phase between the external output control clock signal CLOCK2 and the internal output control clock signal clock2 as shown in FIG. 4B, such a fluctuation in the internal reference potential Vref as shown in FIG. 5B, etc. It is, therefore, possible to suppress degradation of the timing margins of the set-up time tS, the hold time tH, and the output time tQ (ts, tH, and tQ, margins respectively) and the voltage margins of the internal reference potential Vref (VrefL and VrefH margins).

Further, in this embodiment, as shown in FIG. 8A, the coupling capacitance C4 between the output power supply line VSSQ and the internal signal line (in) through which the internal input signal Din is propagated can be reduced as compared to the conventional implementation. With this, the internal input signal Din is less influenced by the output power supply line VSSQ, thus making it possible to suppress fluctuations in the internal input signal Din etc. The fluctuations in the internal input signal Din may contribute to the degradation of the tS, tH, tQ, VrefL, and VrefH margins.

This embodiment can exclude such a factor and so is highly effective to suppress the degradation of the tS, tH, tQ, VrefL, and VrefH margins.

The following will describe one layout example of the semiconductor IC device regarding the one embodiment of the present invention.

Figure 9:
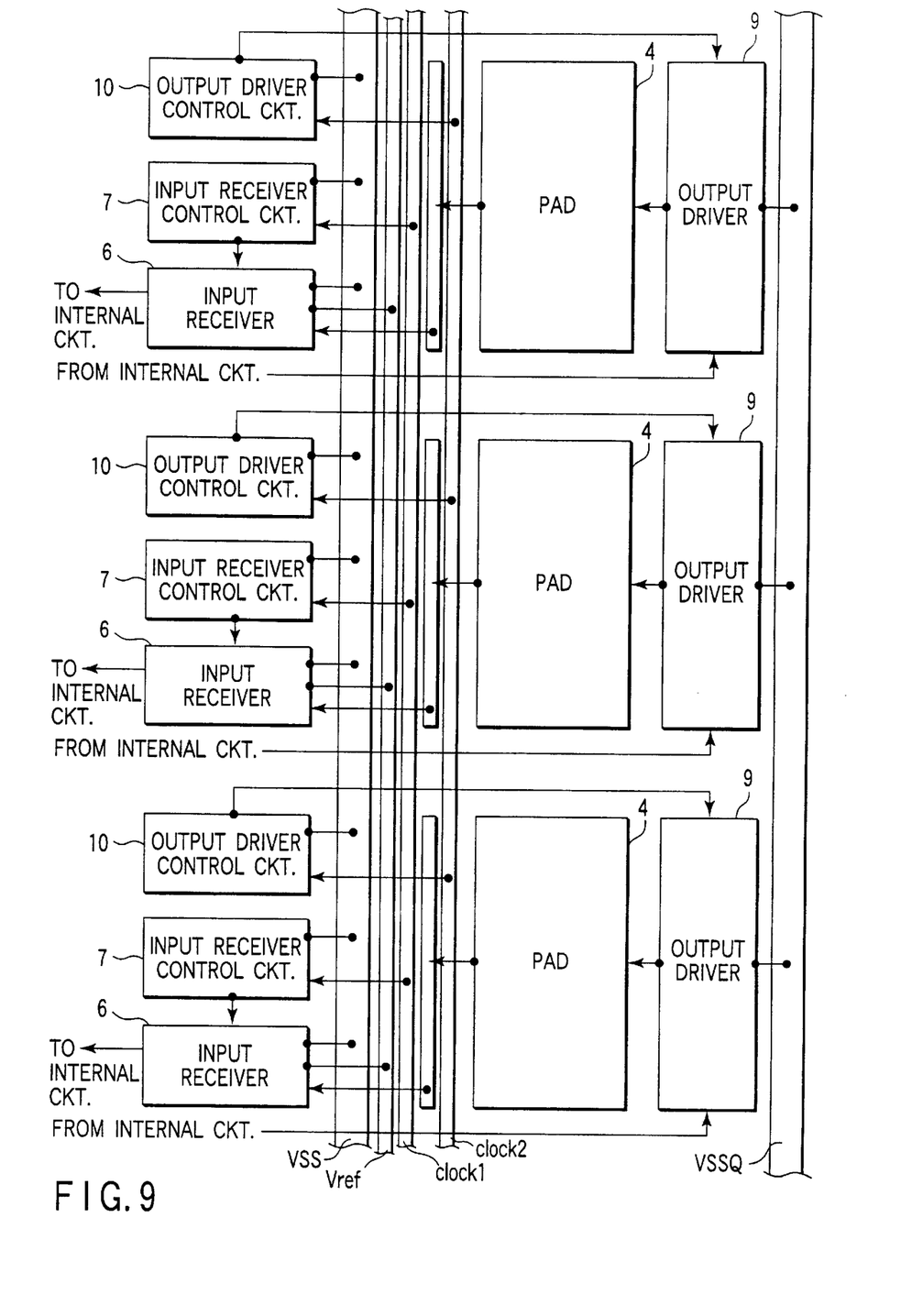
FIG. 9 is a diagram for showing one layout example of the semiconductor IC device regarding the one embodiment of the present invention.

FIG. 9 is a diagram for showing one layout example of the semiconductor IC device regarding the one embodiment of the present invention.

As shown in FIG. 9, in this layout example, a layout of FIG. 7 is repeated as many times as required in, for example, a peripheral circuit region of the synchronous semiconductor memory. The peripheral circuit region is typically disposed at a central section of the semiconductor chip; in fact, it is disposed, for example, at the central section of the chip in the layout shown in FIG. 9. In the layout of FIG. 9, however, it need not always be disposed at the center but may be at a periphery of the chip.

The following will describe one system example using the semiconductor IC device regarding the one embodiment of the present invention.

Figure 10:
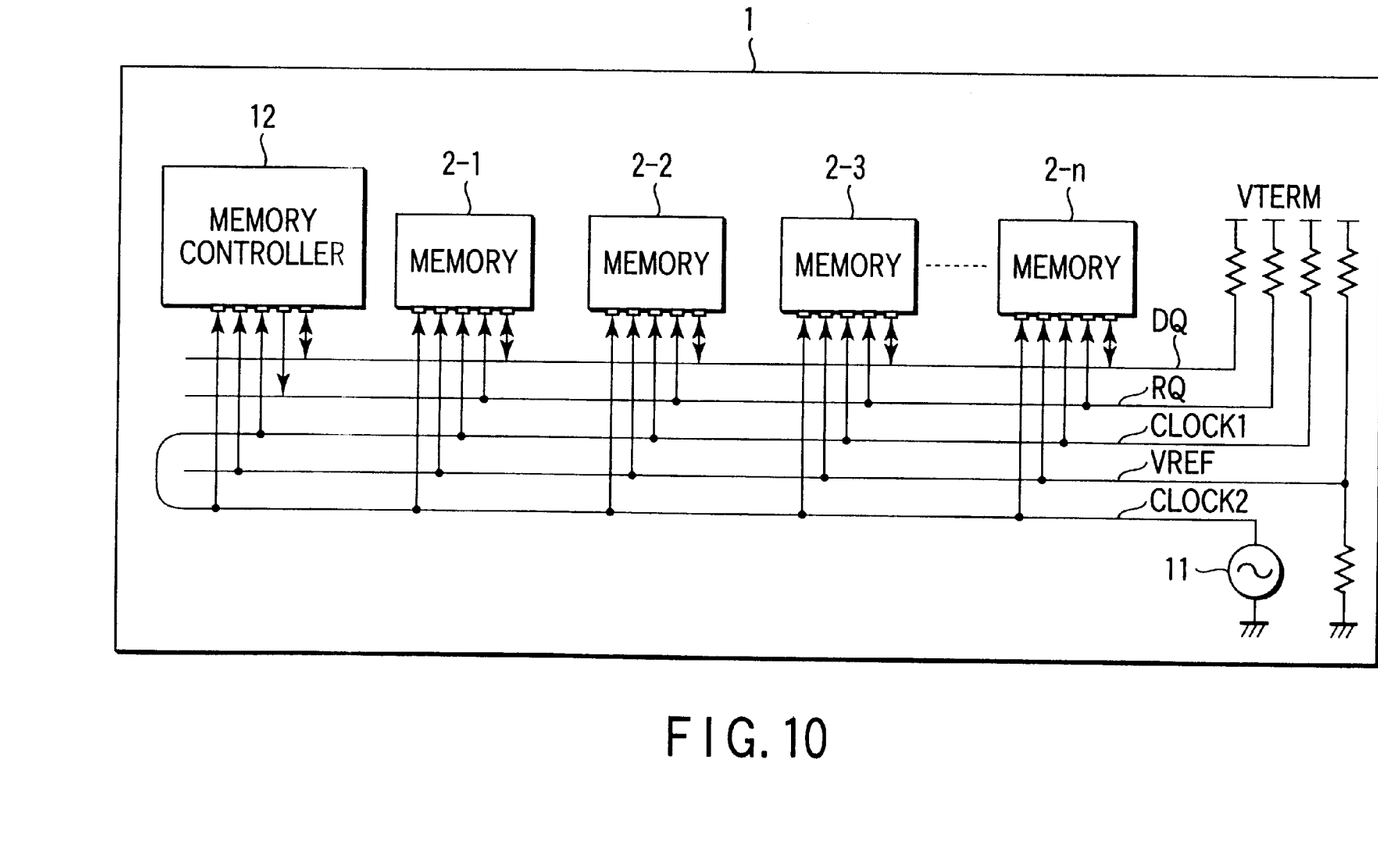
FIG. 10 is a block diagram for showing one system example using the semiconductor IC device regarding the one embodiment of the present invention.

FIG. 10 is a block diagram for showing one system example using the semiconductor IC device regarding the one embodiment of the present invention. This one system example is a DRAM system.

As shown in FIG. 10, on the wiring board 1 are arranged as external wiring lines the external signal line (DQ) through which are propagated the external input/external output data signals DIN/DOUT, the external control signal line (RQ) through which are propagated command and address signals, the external reference potential line (VREF line) to which is applied the external reference potential VREF used in decision of the logical level of the signal propagating the external data signal DQ, the external input control clock signal line (CLOCK1 line) through which is propagated the external input control clock signal CLOCK1, and the external output control clock signal line (CLOCK2 line) through which is propagated the external output control clock signal CLOCK2.

Of these external wiring lines, the DQ and RQ lines have their respective end terminated at a terminating potential VTERM. Moreover, the end of the CLOCK1 (external input control clock signal) line is similarly terminated at the terminating potential VTERM via a terminating resistor. In addition, the CLOCK1 line is folded back on the wiring board 1 to provide the CLOCK2 (external output control clock signal) line. The end of the CLOCK2 line is connected to a clock signal source 11. At the end of the VREF line is applied the external reference potential VREF by resistance division.

On the wiring board 1 are arranged one memory controller 12 and n number of synchronous DRAMs 2-1 through 2-n. The memory controller 12 and n number of synchronous DRAMs 2-2 through 2-n respectively employ the semiconductor IC device of the present invention, of which the synchronous DRAMs 2-1 through 2-n, in particular, uses such a synchronous semiconductor memory as shown in FIGS. 1 and 2.

The operations are described as follows.

<Writing in Data>

As shown in FIG. 10, the memory controller 12 selects, for example, one of the synchronous DRAMs 2-1 through 2-n to then output an address and a data write-in commands for thus selected DRAM onto the RQ line on the wiring board 1 in synchronization with the external input control clock signal CLOCK1.

It is here assumed that the command from the memory controller 12 selected a DRAM2-n. Then, the memory controller 12 outputs input data DIN for thus selected DRAM2-n onto the DQ line on the wiring board 1 in synchronization with the external input control clock signal CLOCK1 as in the case of the address and the command.

The data DIN output on the DQ line is input via the external pin and the pad of the selected DRAM2-n into the input circuit of the DRAM2-n. Then, in the DRAM2-n, such operations are carried out as described in the above-mentioned item <Operations when inputting signal>. With this, the input data DIN is written into the selected address of the DRAM2-n.

<Data Read-out>

As shown in FIG. 10, the memory controller 12 outputs the above-mentioned address and a data read-out command onto the RQ line on the wiring board 1 in synchronization with the external output control clock signal CLOCK1. It is here assumed that a DRAM2-n is selected.

The selected DRAM2-n responds to the command from the memory controller 12 to output internal output data from its own memory core section. The internal output data is input to the output driver of the DRAM2-n. Then, in the DRAM2-n, such operations are carried out as those described in the above-mentioned item <Operations when outputting signal>. The output driver of the external DRAM2-n shifts the potential of the pad lower or higher than the terminating potential VTERM in synchronization with the internal output control clock signal clock2 based on the logical level of the internal output data. With this, the output data is output onto the DQ line on the wiring board 1.

The output data DOUT thus output onto the DQ line is input to the external pin of the memory controller 12, which in turn takes in, for example, the input data DOUT in synchronization with the internal output control clock signal clock2.

The semiconductor IC device according to the present invention can thus be applied well to such a DRAM memory system.

As mentioned above, according to the one embodiment of the present invention, it is possible to provide a semiconductor IC device and semiconductor device system that can suppress the degradation of at least one of the input/output timing margin and the voltage margin.

Although the present invention has been described with reference to one embodiment, the present invention is not limited thereto and can be varied variously within a range of the gist thereof.

Furthermore, the present invention is not limited to only the above-mentioned one embodiment.

Further, the above-mentioned embodiment contains a variety of steps of the present invention, so that a plurality of components disclosed in the one embodiment may be combined appropriately to thereby extract any one of the plurality of steps of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
a pad array including a plurality of pads;
a first circuit array arranged at one side of said pad array, said first circuit array including a plurality of input receiver, a plurality of input receiver control circuits, and a plurality of output driver control circuits;
a first power supply line arranged between said first circuit array and said pad array, said first power supply line being connected to said plurality of input receivers, said plurality of input receiver control circuits, and said plurality of output driver control circuits;
a reference potential line arranged between said first circuit array and said pad array, said reference potential line being connected to said plurality of input receivers;
an input control clock signal line arranged between said first circuit array and said pad array, said input control clock signal line being connected to said plurality of input receiver control circuits;
a plurality of input signal lines arranged between said first circuit array and said pad array, said plurality of input signal lines being connected to said plurality of input receivers;
an output control clock signal line arranged between said first circuit array and said pad array, said output control clock signal line being connected to said plurality of output driver control circuits;
a second power supply line arranged at the other side of said pad array; and
a second circuit array arranged between said second power supply line and said pad array, said second circuit array including a plurality of output drivers connected to said second power supply line.

2. The device according to claim 1, wherein said plurality of pads is each connected to said plurality of input signal lines and said plurality of output drivers.

3. The device according to claim 1, wherein said plurality of input receivers each decides a logical level of an input signal input at each of said plurality of input signal lines based on a reference potential supplied onto said reference potential line.

4. The device according to claim 1, wherein said plurality of input receiver control circuits each controls said plurality of input receivers based on an input control clock signal supplied onto said input control clock signal line.

5. The device according to claim 1, wherein said plurality of output driver control circuits each controls said plurality of output drivers based on an output control clock signal supplied onto said output control clock signal line.

6. The device according to claim 1, wherein said plurality of output drivers each shifts up or down a potential of said plurality of pads based on an output signal supplied from an internal circuit.

7. The device according to claim 1, wherein said plurality of pads connectable to an external signal line terminated at a terminating potential, so that when said plurality of pads is connected to said external signal line, said plurality of output drivers shifts a potential of said plurality of pads lower than or higher than said terminating potential based on said output signal supplied from said internal circuit.

8. The device according to claim 1, wherein said first and second power supply lines each is a ground potential line.

9. A semiconductor device system comprising:
a wiring board; and
a semiconductor integrated circuit device electrically coupled to said wiring board, said wiring board including:
an external signal line to which is applied an external signal;

an external reference potential line to which is applied an external reference potential used to decide a logical level of said external signal;

an external input control clock signal line to which is applied an external input control clock signal; and an external output control clock signal line to which is applied an external output control clock signal, said semiconductor integrated circuit device including:

a pad array, said pad array including a first pad electrically coupled to said external signal line, a second pad electrically coupled to said external reference potential line, a third pad electrically coupled to said external input control clock signal line, and a fourth pad electrically coupled to said external output control clock signal line;

an internal reference potential line, said internal reference potential line arranged at one side of said pad array and electrically connected to said second pad;

an internal input control clock signal line, said internal input control clock signal line arranged at said one side of said pad array and electrically coupled to said third pad;

an internal output control clock signal line, said internal output control clock signal line arranged at said one side of said pad array and electrically coupled to said fourth pad;

an input control circuit, said input control circuit arranged at said one side of said pad array and electrically coupled to said internal input control clock signal line;

an input receiver, said input receiver arranged at said one side of said pad array and electrically coupled to said input control circuit, said first pad and said internal reference potential line;

an output control circuit, said output control circuit arranged at said one side of said pad array and electrically coupled to said internal output control clock signal line;

a first power supply line, said first power supply line arranged at said one side of said pad array and electrically coupled to said input control circuit, said input receiver and said output control circuit;

an output driver, said output driver arranged at said the other side of said pad array and electrically coupled to said output control circuit and said first pad; and a second power supply line, said second power supply line arranged at said the side of said pad array and electrically coupled to said output driver.

10. The system according to claim 9, wherein said semiconductor IC device is a semiconductor memory.

* * * * *